US012701751B2

(12) United States Patent
Sung et al.

(10) Patent No.: US 12,701,751 B2
(45) Date of Patent: *Aug. 4, 2026

(54) DOPING PROFILE FOR STRAINED SOURCE/DRAIN REGION

(71) Applicant: Taiwan Semiconductor Manufacturing Company, Ltd., Hsin-Chu (TW)

(72) Inventors: Hsueh-Chang Sung, Zhubei City (TW); Tsz-Mei Kwok, Hsinchu (TW); Kun-Mu Li, Zhudong Township (TW); Tze-Liang Lee, Hsinchu (TW); Chii-Horng Li, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 175 days.

This patent is subject to a terminal disclaimer.

(21) Appl. No.: 18/359,156

(22) Filed: Jul. 26, 2023

(65) Prior Publication Data

US 2023/0369491 A1 Nov. 16, 2023

Related U.S. Application Data

(60) Continuation of application No. 17/110,592, filed on Dec. 3, 2020, now Pat. No. 11,749,752, which is a
(Continued)

(51) Int. Cl.
| | |
|---|---|
| *C30B 25/14* | (2006.01) |
| *H01L 29/36* | (2006.01) |
(Continued)

(52) U.S. Cl.
CPC ....... *H10D 30/797* (2025.01); *H10D 30/0223* (2025.01); *H10D 30/601* (2025.01);
(Continued)

(58) Field of Classification Search
CPC ............. H10D 30/797; H10D 30/0223; H10D 30/601; H10D 62/021; H10D 62/151;
(Continued)

(56) References Cited

U.S. PATENT DOCUMENTS

| | | | |
|---|---|---|---|
| 4,145,703 | A | 3/1979 | Blanchard et al. |
| 4,173,765 | A | 11/1979 | Heald et al. |
(Continued)

FOREIGN PATENT DOCUMENTS

| | | |
|---|---|---|
| CN | 101572246 A | 11/2009 |
| EP | 1677360 A2 | 7/2006 |
(Continued)

OTHER PUBLICATIONS

U.S. Appl. No. 14/180,490, filed Feb. 14, 2014.
(Continued)

*Primary Examiner* — Leonard Chang
*Assistant Examiner* — Tsz K Chiu
(74) *Attorney, Agent, or Firm* — Eschweiler & Potashnik, LLC

(57) ABSTRACT

The present disclosure relates to an integrated chip. The integrated chip includes a gate structure arranged over a substrate and a source/drain region arranged within the substrate along a side of the gate structure. The source/drain region includes a first layer lining interior sidewalls and a horizontally extending surface of the substrate, and a second layer lining interior sidewalls and a horizontally extending surface of the first layer. The first layer has a strain inducing component with a first strain inducing component concentration that continually decreases from an outermost sidewall of the first layer facing the substrate to one of the interior sidewalls of the first layer.

20 Claims, 6 Drawing Sheets

Related U.S. Application Data division of application No. 15/589,259, filed on May 8, 2017, now Pat. No. 10,861,971, which is a continuation of application No. 14/134,302, filed on Dec. 19, 2013, now Pat. No. 9,691,898.

(51) Int. Cl.

| | |
|---|---|
| *H10D 30/01* | (2025.01) |
| *H10D 30/60* | (2025.01) |
| *H10D 30/69* | (2025.01) |
| *H10D 62/00* | (2025.01) |
| *H10D 62/13* | (2025.01) |
| *H10D 62/40* | (2025.01) |
| *H10D 62/822* | (2025.01) |
| *H10D 64/01* | (2025.01) |
| *H10P 14/20* | (2026.01) |
| *H10P 70/00* | (2026.01) |
| *H10P 95/90* | (2026.01) |

(52) U.S. Cl.
CPC ......... *H10D 62/021* (2025.01); *H10D 62/151* (2025.01); *H10D 62/405* (2025.01); *H10D 62/822* (2025.01); *H10D 64/021* (2025.01); *H10P 14/3411* (2026.01); *H10P 70/20* (2026.01); *H10P 95/90* (2026.01); *H10D 30/0275* (2025.01)

(58) Field of Classification Search
CPC .. H10D 62/405; H10D 62/822; H10D 64/021; H10D 30/0275; H10D 30/791; H10D 10/891; H10D 30/751; H10D 30/796; H10D 62/834; H10D 64/017; H10D 30/62; H10D 30/6219; H10D 64/259; H10D 84/017; H10D 84/0186; H10D 84/0193; H10D 84/038; H10D 84/853; H10D 30/0323; H10D 30/6713; H10D 30/6744; H10D 30/6755; H10D 30/6758; H10D 30/6759; H10D 62/116; H10D 64/027; H10D 64/512; H10D 64/513; H10D 64/516; H10D 64/518; H10D 86/01; H10D 86/201; H10D 30/021; H10D 30/0227; H10D 30/60; H10D 84/85; H10D 30/022; H10D 30/024; H10D 62/50; H10D 84/0167; H10D 30/0241; H10D 30/0281; H10D 30/4738; H10D 30/6211; H10D 30/65; H10D 30/6735; H10D 48/032; H10D 62/105; H10D 62/122; H10D 62/153; H10D 62/60; H10D 62/83; H10D 62/832; H10D 64/62; H10D 64/667; H10D 84/0158; H10D 84/834; H01L 21/324; H01L 21/02532; H01L 21/26506; H01L 21/02381; H01L 21/0245; H01L 21/02502; H01L 21/02664; H01L 21/26513; H01L 21/2658; H01L 21/26586; H01L 21/26593; H01L 21/02592; H01L 21/0262; H01L 21/02639; H01L 21/20; H01L 21/265; H01L 21/28512; H01L 21/28518; H01L 21/28525; H01L 21/31155; H01L 21/3215; H01L 21/32155; H01L 21/76805; H01L 21/76831; H01L 21/76843; H01L 21/76864; H01L 21/76895; H01L 23/535

See application file for complete search history.

(56) References Cited

U.S. PATENT DOCUMENTS

| | | | |
|---|---|---|---|
| 4,194,283 A | | 3/1980 | Hoffmann |
| 4,214,312 A | | 7/1980 | Amir |
| 4,222,062 A | | 9/1980 | Trotter et al. |
| 4,222,063 A | | 9/1980 | Rodgers |
| 4,407,058 A | | 10/1983 | Fatula, Jr. et al. |
| 7,456,087 B2 | * | 11/2008 | Cheng ................. H10D 62/021 |
| | | | 438/584 |
| 7,544,577 B2 | | 6/2009 | Adam et al. |
| 7,544,997 B2 | * | 6/2009 | Zhang ................. H10D 62/151 |
| | | | 257/E21.182 |
| 7,553,717 B2 | | 6/2009 | Chakravarthi et al. |
| 7,608,515 B2 | | 10/2009 | Chen et al. |
| 7,719,031 B2 | | 5/2010 | Saitoh et al. |
| 7,821,044 B2 | | 10/2010 | Bohr et al. |
| 8,012,820 B2 | | 9/2011 | Majumdar et al. |
| 8,450,165 B2 | | 5/2013 | Bohr |
| 8,629,426 B2 | | 1/2014 | Lin et al. |
| 9,064,893 B2 | | 6/2015 | Liao et al. |
| 9,236,475 B2 | | 1/2016 | Kim et al. |
| 9,287,398 B2 | | 3/2016 | Kwok |
| 9,679,977 B2 | * | 6/2017 | Kim ................. H10D 84/0193 |
| 9,691,868 B2 | | 6/2017 | Song et al. |
| 9,691,898 B2 | | 6/2017 | Sung et al. |
| 9,748,386 B2 | | 8/2017 | Hu et al. |
| 10,032,873 B2 | | 7/2018 | Chang et al. |
| 10,170,555 B1 | | 1/2019 | Liao et al. |
| 2003/0201461 A1 | | 10/2003 | Sato et al. |
| 2004/0173815 A1 | | 9/2004 | Yeo et al. |
| 2005/0118793 A1 | | 6/2005 | Snyder et al. |
| 2005/0184345 A1 | | 8/2005 | Lin et al. |
| 2005/0285203 A1 | | 12/2005 | Fukutome et al. |
| 2006/0166492 A1 | | 7/2006 | Orlowski et al. |
| 2006/0251800 A1 | | 11/2006 | Weidman et al. |
| 2007/0004123 A1 | | 1/2007 | Bohr et al. |
| 2007/0096194 A1 | | 5/2007 | Streck et al. |
| 2007/0210448 A1 | | 9/2007 | Wong et al. |
| 2008/0006818 A1 | | 1/2008 | Luo et al. |
| 2008/0048217 A1 | | 2/2008 | Kim et al. |
| 2008/0197412 A1 | | 8/2008 | Zhang et al. |
| 2009/0289365 A1 | | 11/2009 | Yang et al. |
| 2010/0078689 A1 | | 4/2010 | Kronholz et al. |
| 2010/0144121 A1 | * | 6/2010 | Chang ................ H10D 30/6211 |
| | | | 438/585 |
| 2010/0244107 A1 | | 9/2010 | Kronholz et al. |
| 2011/0003450 A1 | | 1/2011 | Lee et al. |
| 2011/0057270 A1 | | 3/2011 | Nishikawa |
| 2011/0127614 A1 | | 6/2011 | Scheiper et al. |
| 2012/0058610 A1 | | 3/2012 | Ookoshi et al. |
| 2012/0138897 A1 | | 6/2012 | Lin et al. |
| 2012/0153387 A1 | | 6/2012 | Murthy et al. |
| 2012/0168821 A1 | | 7/2012 | Cheng et al. |
| 2012/0181625 A1 | | 7/2012 | Kwok et al. |
| 2012/0205715 A1 | | 8/2012 | Kwok et al. |
| 2012/0223364 A1 | | 9/2012 | Chung et al. |
| 2012/0319203 A1 | | 12/2012 | Cheng et al. |
| 2013/0069172 A1 | | 3/2013 | Liao et al. |
| 2013/0109144 A1 | | 5/2013 | Kim et al. |
| 2013/0207166 A1 | | 8/2013 | Chen et al. |
| 2014/0027909 A1 | | 1/2014 | Gstrein et al. |
| 2014/0070377 A1 | | 3/2014 | Yu et al. |
| 2014/0087537 A1 | | 3/2014 | Kim et al. |
| 2014/0113424 A1 | | 4/2014 | Lin et al. |
| 2014/0175556 A1 | | 6/2014 | Chen et al. |
| 2014/0335674 A1 | | 11/2014 | Liao et al. |
| 2015/0069466 A1 | | 3/2015 | Chang et al. |
| 2015/0179796 A1 | | 6/2015 | Sung et al. |
| 2015/0236155 A1 | | 8/2015 | Chiu et al. |
| 2015/0236157 A1 | | 8/2015 | Kwok et al. |
| 2015/0270342 A1 | | 9/2015 | Tsai et al. |
| 2017/0005196 A1 | | 1/2017 | Chen et al. |
| 2017/0084689 A1 | * | 3/2017 | Chen ................... H10D 62/822 |

(56)     References Cited

U.S. PATENT DOCUMENTS

FOREIGN PATENT DOCUMENTS

| | | | |
|---|---|---|---|
| JP | 2008177319 A | 7/2008 | |
| JP | 2008218725 A | 9/2008 | |
| KR | 20130045716 A | 5/2013 | |
| TW | 200620664 A | 6/2006 | |
| TW | 201242022 A | 10/2012 | |
| TW | 201342614 A * | 10/2013 | ....... H01L 21/02532 |
| WO | 2012087404 A1 | 6/2012 | |

OTHER PUBLICATIONS

Non-Final Office Action dated Jun. 5, 2015 for U.S. Appl. No. 14/180,490.
Notice of Allowance dated Nov. 6, 2015 U.S. Appl. No. 14/180,490.
Non Final Office Action Dated Aug. 16, 2016 U.S. Appl. No. 15/017,698.
Notice of Allowance Dated Feb. 17, 2017 U.S. Appl. No. 15/017,698.
Non Final Office Action Dated Sep. 3, 2015 for U.S. Appl. No. 15/017,698.
Final Office Action Dated Apr. 22, 2016 for U.S. Appl. No. 15/017,698.
Final Office Action Dated Aug. 16, 2016 for U.S. Appl. No. 15/017,698.
Notice of Allowance Dated Jan. 23, 2017 for U.S. Appl. No. 15/017,698.
Non-Final Office Action received Sep. 27, 2017 in connection with U.S. Appl. No. 15/612,137.
Notice of Allowance received Feb. 12, 2018 in connection with U.S. Appl. No. 15/612,137.
Non-Final Office Action dated Nov. 8, 2017 for U.S. Appl. No. 15/589,259.
Final Office Action dated Jun. 14, 2018 for U.S. Appl. No. 15/589,259.
Non-Final Office Action dated Aug. 12, 2019 for U.S. Appl. No. 15/589,259.
Non-Final Office Action dated Mar. 5, 2020 for U.S. Appl. No. 15/589,259.
Notice of Allowance dated Aug. 24, 2020 for U.S. Appl. No. 15/589,259.
Non-Final Office Action dated Sep. 6, 2022 for U.S. Appl. No. 17/110,592.
Final Office Action dated Dec. 21, 2022 for U.S. Appl. No. 17/110,592.
Notice of Allowance dated May 2, 2023 for U.S. Appl. No. 17/110,592.

* cited by examiner

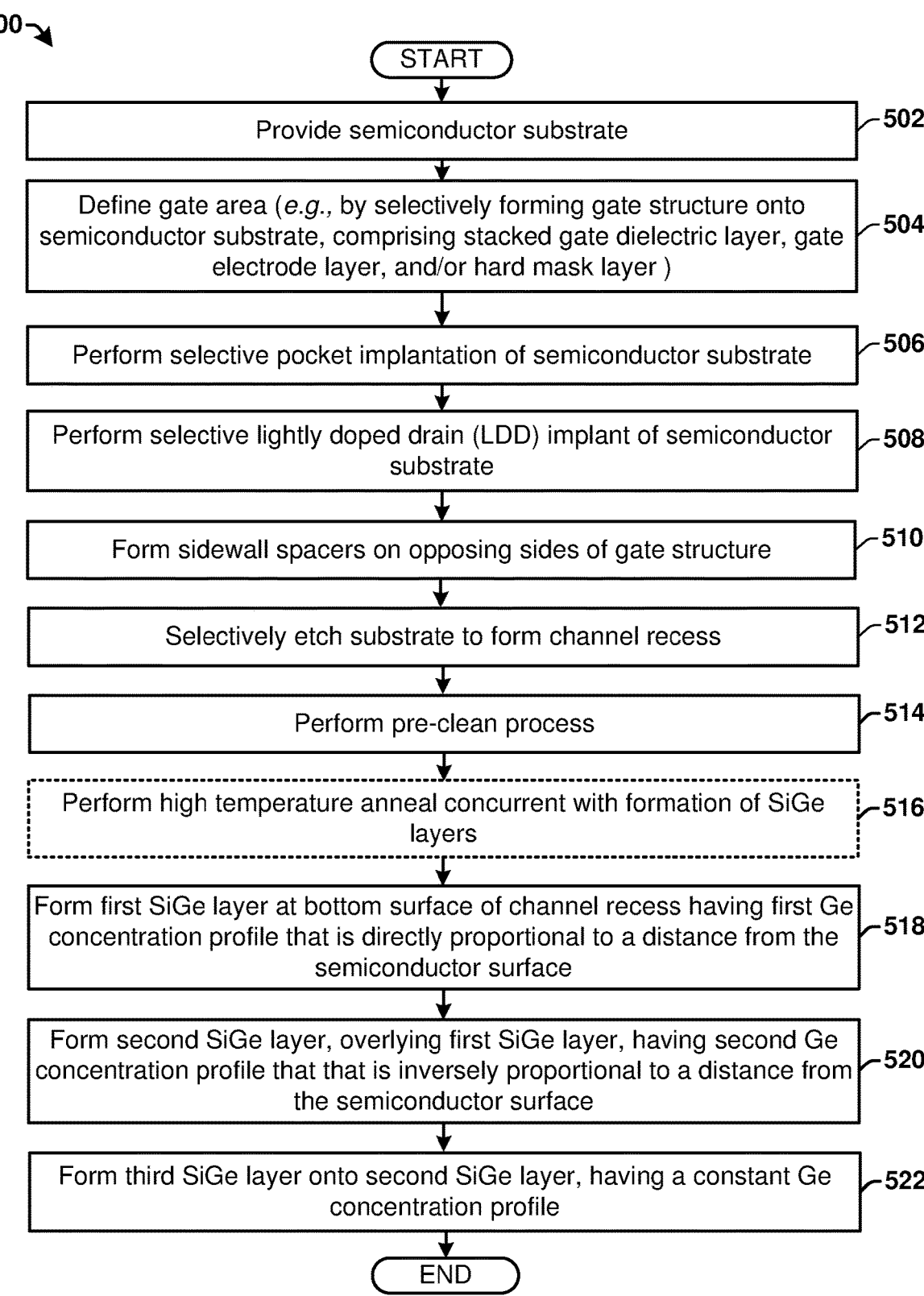

500

START

| Provide semiconductor substrate | 502 |

| Define gate area (*e.g.*, by selectively forming gate structure onto semiconductor substrate, comprising stacked gate dielectric layer, gate electrode layer, and/or hard mask layer ) | 504 |

| Perform selective pocket implantation of semiconductor substrate | 506 |

| Perform selective lightly doped drain (LDD) implant of semiconductor substrate | 508 |

| Form sidewall spacers on opposing sides of gate structure | 510 |

| Selectively etch substrate to form channel recess | 512 |

| Perform pre-clean process | 514 |

| Perform high temperature anneal concurrent with formation of SiGe layers | 516 |

| Form first SiGe layer at bottom surface of channel recess having first Ge concentration profile that is directly proportional to a distance from the semiconductor surface | 518 |

| Form second SiGe layer, overlying first SiGe layer, having second Ge concentration profile that that is inversely proportional to a distance from the semiconductor surface | 520 |

| Form third SiGe layer onto second SiGe layer, having a constant Ge concentration profile | 522 |

END

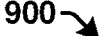
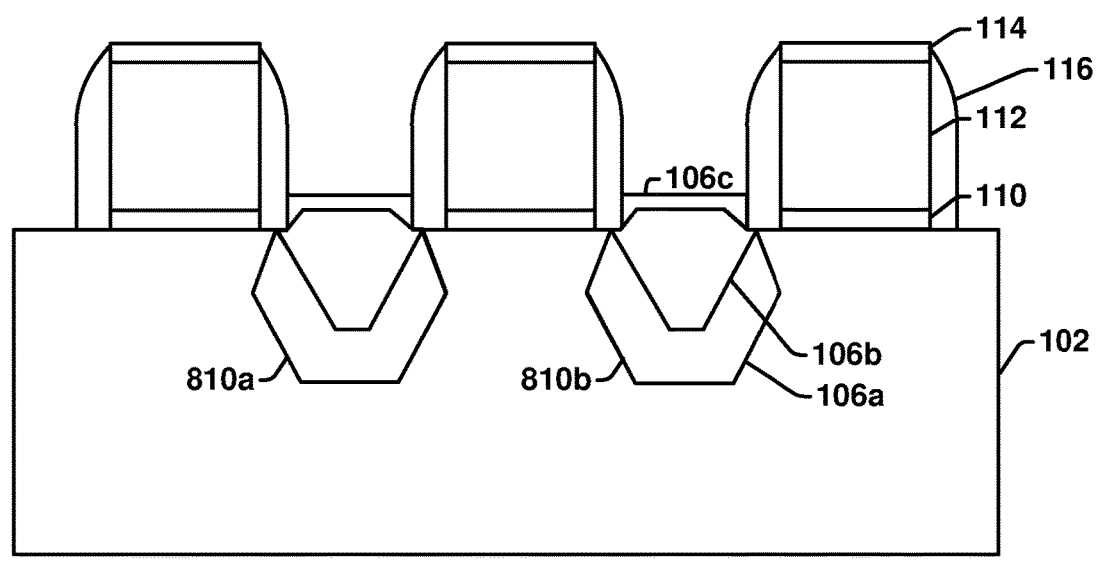
Fig. 9

DOPING PROFILE FOR STRAINED SOURCE/DRAIN REGION

REFERENCE TO RELATED APPLICATIONS

This application is a Continuation of U.S. application Ser. No. 17/110,592, filed on Dec. 3, 2020, which is a Divisional of U.S. application Ser. No. 15/589,259, filed on May 8, 2017 (now U.S. Pat. No. 10,861,971, issued on Dec. 8, 2020), which is a Continuation of U.S. application Ser. No. 14/134,302, filed on Dec. 19, 2013 (now U.S. Pat. No. 9,691,898, issued on Jun. 27, 2017). The contents of the above-referenced patent applications are hereby incorporated by reference in their entirety.

BACKGROUND

The semiconductor industry has continually improved the performance of integrated chips by scaling the minimum feature size of integrated chip (IC) components according to Moore's law. However, in recent years scaling of some IC components has become increasingly difficult. To alleviate the demands of scaling, the semiconductor industry has looked for other ways in which to improve the performance of integrated chips.

Strain engineering is often utilized to improve the performance of transistor devices. For example, by inducing a compressive stress onto a channel region of a PMOS transistor, the mobility and performance of the transistor is improved. By using strain engineering to improve transistor performance, the demands to scale an integrated chip design (e.g., to further reduce the gate dielectric thickness) are alleviated.

BRIEF DESCRIPTION OF THE DRAWINGS

FIG. 5 illustrates a flow diagram of some additional embodiments of a method of forming a strained channel transistor device having a discontinuous germanium concentration profile within a channel region.

FIGS. 6, 7, 8A-8B, 9 illustrate some embodiments of cross-sectional views of a semiconductor substrate showing a method of forming a strained channel transistor device having a discontinuous germanium concentration profile within a channel region.

DETAILED DESCRIPTION

Figure 1:
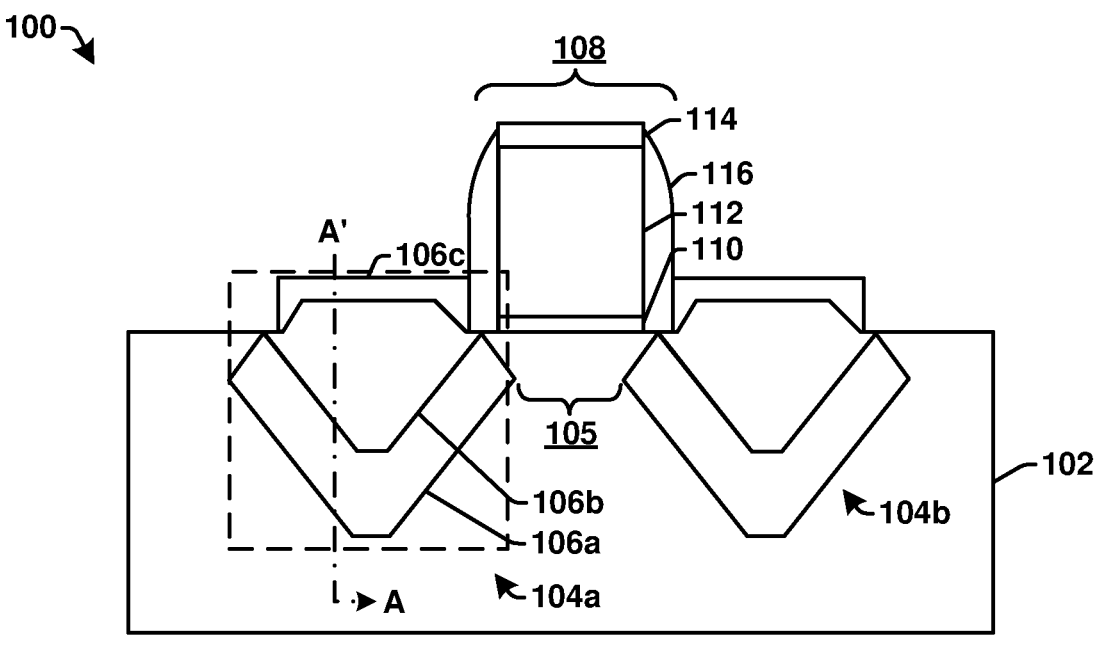
FIG. 1 illustrates a cross-sectional view of some embodiments of a strained channel transistor device having a discontinuous germanium concentration profile within a channel region.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

A strained channel MOSFET (metal-oxide-semiconductor field effect transistor) device may be formed by forming strain inducing source and drain regions at opposing ends of a channel region. The strain inducing source and drain regions are formed by the formation of source and drain recesses within a substrate, and subsequently depositing a strain-inducing layer within the source and drain recesses. For example, a germanium-containing material, such a silicon germanium (SiGe), may be deposited within a source or drain recess of a p-channel MOSFET to provide for a compressive strain within a channel region therebetween. Similarly, a carbon-containing material such as silicon carbide (SiC) may be utilized for electron mobility enhancement of an n-channel MOSFET.

For p-channel MOSFET channel mobility enhancement in advanced technology node development (i.e., node-28 and below) a germanium (Ge) concentration of greater than approximately 40% (e.g., $S_{i1-x}Ge_x$ where x>40%) may utilized within a source or drain recess. Usually, the Ge concentration increases continuously from a bottom to a top of a recess. While gradually increasing the germanium concentration reduces a chance of dislocation formation, it may cause lower germanium concentration close to channel and therefore a loss of strain benefit.

Accordingly, the present disclosure relates to a transistor device having a strained source/drain region comprising a strained inducing material having a discontinuous germanium concentration that provides for improved strain boosting and dislocation propagation, and an associated method of formation. In some embodiments, the transistor device comprises a gate structure disposed onto a semiconductor substrate. A source/drain region comprising a strain inducing material is disposed at a position adjoining the gate structure within a source/drain recess in the semiconductor substrate. The strain inducing material has a discontinuous germanium concentration profile along a line extending from a bottom surface of the source/drain recess to a top surface of the source/drain recess. The discontinuous germanium concentration profile changes from a high germanium concentration at a first position to a lower germanium concentration at a second position overlying the first position, thereby providing for a higher doping concentration abutting a channel region of the transistor.

FIG. 1 illustrates a cross-sectional view of some embodiments of a strained channel transistor device 100 having a discontinuous germanium concentration profile within a source/drain region 104.

The strained channel transistor device 100 comprises a strained source region 104a and a strained drain region 104b disposed within a semiconductor substrate 102. The strained source and drain regions, 104a and 104b, are separated by a channel region 105. A gate structure 108, configured to control the flow of charge carriers (e.g., electrons and/or holes) within the channel region 105, is disposed onto the semiconductor substrate 102 at a position laterally located between the source and drain regions, 104a and 104b, and at a position vertically overlying the channel region 105.

In some embodiments, the gate structure 108 may comprise a stacked structure comprising a gate dielectric layer 110, a gate electrode layer 112, and a hardmask layer 114.

The gate dielectric layer 110 is disposed onto the semiconductor substrate 102. The gate electrode layer 112 (e.g., poly-silicon, replacement metal, etc.) is disposed onto the gate dielectric layer 110, and the hardmask layer 114 (e.g., $SiO_2$ or other dielectric) is disposed onto the gate electrode layer 112. In some embodiments, sidewall spacers 116 are located on opposing sides of the gate structure 108. The sidewall spacers 116 are configured to isolate the gate electrode layer 112 from the strained source and drain regions, 104a and 104b.

The strained source and drain regions, 104a and 104b, comprise a strain inducing material disposed within recesses within the semiconductor substrate 102 at positions adjoining the gate structure 108. The strained source and drain regions, 104a and 104b and configured to induce a strain (e.g., a compressive strain or a tensile strain) on the channel region 105. The strain inducing material has a strain inducing component with a discontinuous concentration profile along a normal line (i.e., perpendicular to a bottom surface) extending from a bottom surface of the strained source and drain regions, 104a and 104b, to a top surface of the strained source and drain regions, 104a and 104b. The discontinuous concentration profile comprises a plurality of discontinuities (e.g., breaks or interruptions in the concentration profile) along the line.

In some embodiments, the strain inducing material may comprise silicon germanium and the strain inducing component may comprise germanium. In such embodiments, the germanium is configured to induce a strain on the channel region 105 due to the difference in lattice constants of germanium (Ge) and silicon (Si). In other embodiments, the strain inducing material may comprise an alternative material, such as silicon carbide (SiC), for example.

In some embodiments, the strain inducing material (e.g., SiGe) may comprise a plurality of distinct epitaxial layers disposed within recesses of the strained source and drain regions, 104a and 104b. In some embodiments, the plurality of distinct epitaxial layers may respectively have different strain inducing component concentration profiles (e.g., germanium concentration profiles) that are discontinuous at an intersection between abutting layers.

For example, the strained source and drain regions, 104a and 104b, may comprise a first SiGe layer 106a, a second SiGe layer 106b, and a third SiGe layer 106c. The first SiGe layer 106a may comprise a first germanium concentration profile that changes from a high germanium concentration at a first position to a lower germanium concentration at a second position overlying the first position. The second SiGe layer 106b may comprise a second germanium concentration profile that is discontinuous with the first concentration profile. In some embodiments, the second germanium concentration profile may change from a low concentration at a third position to a higher concentration at a fourth position overlying the third position. The third SiGe layer 106c may comprise a second germanium concentration profile that is discontinuous with the second concentration profile. In some embodiments, the third SiGe layer 106c may comprise a SiGe layer having a constant germanium concentration or a silicon cap layer comprising un-doped pure silicon (i.e., a $SiGe_x$ layer, where x=0).

Although strained source and drain regions, 104a and 104b, are illustrated in strained channel transistor device 100 as tri-layer regions, it will be appreciated that the disclosed strained source and drain regions, 104a and 104b, are not limited to such layers. In other embodiments, the strained source and drain regions, 104a and 104b, may comprise additional layers (e.g., a fourth SiGe layer, a fifth SiGe layer, etc.).

Figure 2:
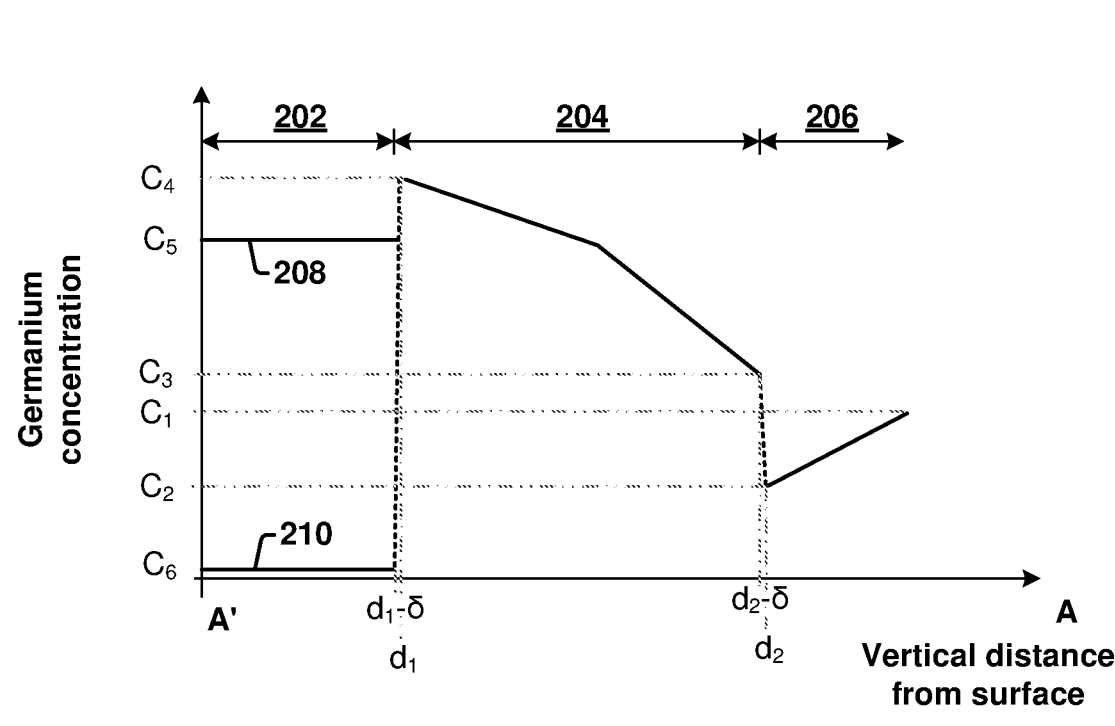
FIG. 2 illustrates some embodiments of a graph showing a germanium concentration profile along a vertical cross-section extending through a channel region.

FIG. 2 illustrates some embodiments of a graph 200 showing a germanium concentration profile along a vertical cross-section A-A' extending through a strained source region (e.g., 104a) and a strained drain region (e.g., 104b). Graph 200 illustrates a doping concentration along a y-axis and a distance from a surface of a semiconductor substrate along an x-axis.

The germanium concentration profile of graph 200 comprises a discontinuous concentration profile for a SiGe source/drain region having three distinct regions 202, 204, and 206 with different germanium concentration profiles (i.e., a tri-layer SiGe source/drain region). The distinct regions 202-206 are marked by breaks or interruptions between adjacent regions.

For example, a first region 206 comprises a first germanium concentration profile for a bottom SiGe layer within a strained source/drain region. The first germanium concentration profile extends from a first germanium concentration $C_1$ at bottom surface of the first region 206 to a second germanium concentration $C_1$, less than the first germanium concentration $C_1$, at a top of the first region 206. In some embodiments, the germanium concentration within the first region 206 may range between a germanium concentration of approximately 40% (at a bottom surface) and a germanium concentration of approximately 10% (at a top surface).

A second region 204 comprises a second germanium concentration profile for a middle SiGe layer within the strained source/drain region. The second germanium concentration profile extends from a third germanium concentration $C_3$ at bottom surface of the second region 204 to a fourth germanium concentration $C_4$, greater than the third germanium concentration $C_3$, at a top of the second region 204. The second germanium concentration profile is discontinuous with the first germanium concentration profile since the third germanium concentration $C_3$ at a depth $d_2$-$\delta$ is different than the second germanium concentration $C_2$ at a depth of $d_2$. In some embodiments, the germanium concentration within the second region 204 may range between a germanium concentration of approximately 30% (at a bottom surface) and a germanium concentration of approximately 70% (at a top surface).

A third region 202 comprises a third germanium concentration profile for a top SiGe layer within the source/drain region. The third germanium concentration profile comprises a constant germanium concentration profile, 208 or 210. In some embodiments, wherein the top SiGe layer comprises a silicon cap layer the constant germanium concentration profile 208 may comprise a concentration $C_5$. In other embodiments, wherein the top SiGe layer comprises a SiGe layer the constant germanium concentration profile 210 may comprise a concentration $C_6$. The third germanium concentration profile is discontinuous with the second germanium concentration profile since germanium concentrations $C_5$ or $C_6$ at a depth $d_1$-$\delta$ are different than the fourth germanium concentration $C_4$ at a depth of $d_1$.

Figure 3:
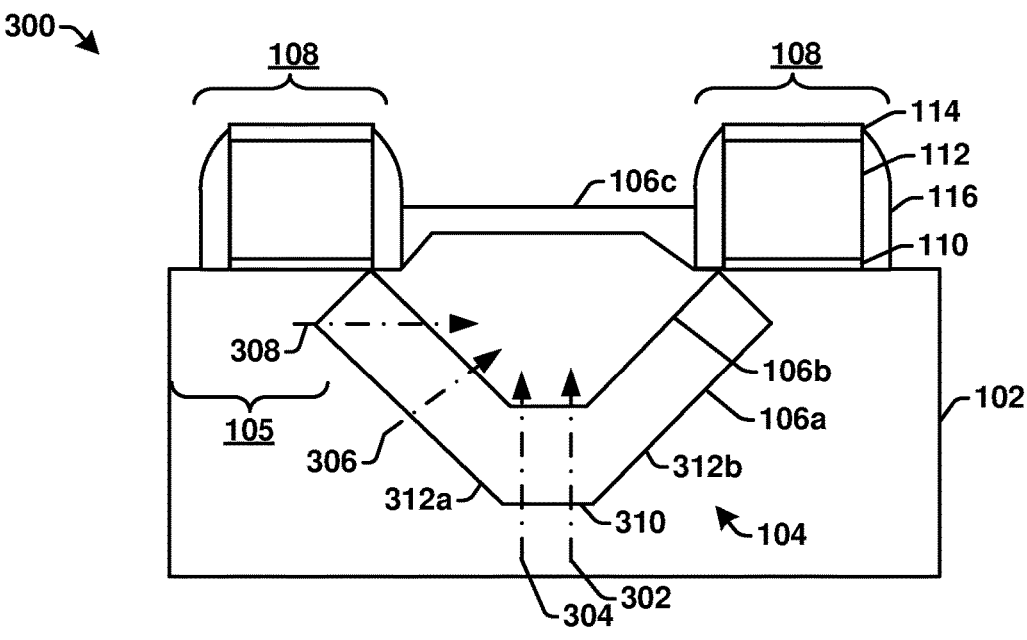
FIG. 3 illustrates a cross-sectional view of some embodiments of a strained channel transistor device having a discontinuous germanium concentration profile within a channel region.

FIG. 3 illustrates a cross-sectional view of some additional embodiments of a strained channel transistor device 300 having a discontinuous germanium concentration profile within a source/drain region.

Strained channel transistor device 300 comprises a source/drain region 104 disposed next to a gate structure 108 in a semiconductor substrate 102. The source/drain region 104 has an anisotropic etch profile that provides for a diamond-shape or "V" shaped cavity in the semiconductor substrate 102. The "V" shaped cavity comprises a <100> surface 310 flanked by <111> surfaces, 312a and 312b.

The source/drain region 104 comprises a bottom/first SiGe layer 106a located below one or more additional SiGe layers 106b-106c. The first SiGe layer 106a is disposed onto the <100> surface 310 and the <111> surfaces, 312a and 312b, which are collectively referred to herein as a bottom surface. The germanium concentration profile of the first SiGe layer 106a decreases from the bottom surface to a position overlying the bottom surface. It will be appreciated that since the source/drain recesses have the <100> surface 310 and the <111> surfaces, 312a and 312b, that the term overlying is not limited to strictly vertically overlying. For example, the term overlying may also mean overlying along a line that is normal to a <100> surface or along a line that is normal to a <111> surface (e.g., overlying along a 450 angle).

In some embodiments, the germanium concentration profile of the first SiGe layer 106a may vary depending on a crystal lattice of an underlying surface (i.e., depending on a direction within the source/drain region). In some embodiments, the first SiGe layer 106a may have a different doping concentration profile along a first line (e.g., 302) extending normal to a first bottom surface comprising the <100> surface 310, than along a second line (e.g., 306) extending normal to a second bottom surface comprising a <111> surface, 312a or 312b.

For example, a first direction 302 extends normal to the <100> surface 310. Along the first direction 302 the germanium concentration profile within the bottom SiGe layer may begin at a value of approximately 25% (at a bottom surface) and may decrease to a value of approximately 12% (at a top surface). Similarly, along a second direction 304, the germanium concentration profile within the first SiGe layer 106a may begin at a value of approximately 25% and may decrease to a value of approximately 12%. By decreasing the germanium concentration profile along the first and second directions, 302 and 304, a lower germanium concentration is achieved near a <111> surface, thereby decreasing dislocation propagation within strained channel transistor device 300.

A third direction 306 extends normal to a <111> surface, 312a or 312b. Along the third direction 306, the germanium concentration profile within the first SiGe layer 106a may begin at a value of approximately 20% and may decrease to a value of approximately 12%.

Along a fourth direction 308, the germanium concentration profile within the first SiGe layer 106a may begin at a value of approximately 25% and may decrease to a value of approximately 12%. By decreasing the germanium concentration profile along the fourth direction 308 from a high germanium concentration to a lower germanium concentration, a higher germanium concentration is achieved close to a channel region 105 and channel strain and device performance is performed.

Figure 4:
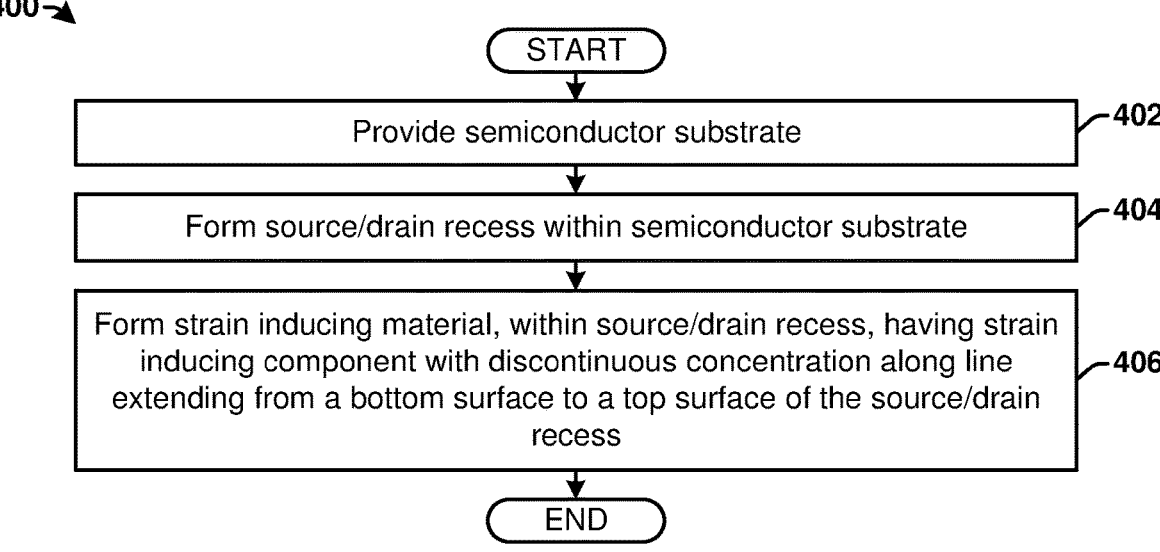
FIG. 4 illustrates a flow diagram of some embodiments of a method of forming a strained channel transistor device having a discontinuous germanium concentration profile within a channel region.

FIG. 4 illustrates a flow diagram of some embodiments of a method 400 of forming a strained channel transistor device having a discontinuous germanium concentration profile within a source/drain region.

At 402, a semiconductor substrate is provided. In various embodiments, the semiconductor substrate 102 may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith.

At 404, a source/drain recess is formed in the semiconductor substrate. In some embodiments, a plurality of etching processes may be used to form the source/drain recess. For example, in some embodiments, an isotropic etching process may be performed on the semiconductor substrate to form a recess in the semiconductor substrate at a position adjoining a gate structure. An anisotropic etch may then be performed to achieve a V shaped source/drain recess.

At 406, a strain inducing material is formed in the source/drain recess to form a source/drain region. The strain inducing material comprises a strain inducing component with a discontinuous concentration profile along a line extending from a bottom surface of the source/drain recess to a top surface of the source/drain recess. In some embodiments, the strain inducing component may comprise germanium, such that the source/drain recess comprises a discontinuous germanium (Ge) concentration along the line extending from a bottom surface of the source/drain recess to a top surface of the source/drain recess.

In some embodiments, the strain inducing material may be formed within the source/drain recess as a plurality of distinct epitaxial layers. In some embodiments, the plurality of distinct epitaxial layers may be formed in-situ within a same processing chamber (i.e., without removing the semiconductor substrate from the processing chamber).

In some embodiments, the distinct epitaxial layers may respectively have different germanium concentration profiles. For example, in some embodiments, a first SiGe layer may be formed at a bottom surface of the source/drain recess. The first SiGe layer comprises a first germanium concentration profile that changes from a high Ge concentration at a first position to a lower Ge concentration at a second position overlying the first position. A second SiGe layer may be subsequently formed at a position overlying first SiGe layer. In some embodiments, the second SiGe layer may comprise a second germanium concentration profile that changes from a low concentration at a third position to a higher concentration at a fourth position overlying the third position. In some embodiments, a third SiGe layer may be formed onto second SiGe layer. In some embodiments, the third SiGe layer may comprise a silicon germanium layer having a constant germanium concentration or a silicon cap layer comprising un-doped pure silicon.

FIG. 5 illustrates a flow diagram of some additional embodiments of a method 500 of forming a strained channel transistor device having a discontinuous germanium concentration profile within a channel region.

While disclosed methods (e.g., methods 400 and 500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a semiconductor substrate is provided.

At 504, a gate area is defined within the semiconductor substrate. In some embodiments, the gate area can be defined by selectively forming a stacked gate structure having a gate oxide material, a gate electrode material, and/or a hard mask on the semiconductor substrate.

At 506, a pocket implantation is performed. The pocket implantation forms pocket implant regions in areas of the semiconductor substrate that are not covered by the stacked gate structure. The pocket implant regions may extend to positions that underlie the stacked gate structure.

At 508, a lightly doped drain (LDD) implant is performed. The LDD implant forms LDD implant regions in areas of the semiconductor substrate that are not covered by the stacked gate structure.

At 510, sidewall spacers are formed on opposing sides of the stacked gate structure.

At 512, the semiconductor substrate is selectively etched to form source and drain recesses on opposing sides of the stacked gate structure. In some embodiments, a plurality of etching processes may be used to form the source and drain recesses within the semiconductor substrate.

At 514, a pre-clean process is performed. The pre-clean process is configured to remove surface defects and/or contaminations from the source and drain recesses prior to deposition of a silicon-germanium (SiGe) material within the source and drain recesses (acts 518-522). In some embodiments, the pre-clean process may comprise a wet clean process (e.g., having a hydrofluoric acid (HF) base) or a dry clean process (e.g., using pre-Ni silicide (SiCoNi) or Certas).

At 516, a high temperature anneal may be performed concurrently with the deposition multi-layer SiGe layer (acts 518-522), in some embodiments. The high temperature anneal may be performed for a time of between approximately 30 s (seconds) and approximately 240 s within a processing chamber held at a temperature in a range of between approximately 700° C. and approximately 900° C. and at a pressure having a range of between approximately 10 torr and approximately 200 torr.

At 518, a first silicon-germanium (SiGe) layer is formed at a bottom surface of the source and drain recesses. The first SiGe layer comprises a first germanium (Ge) concentration that decreases from a high concentration at a first position to a low concentration at a second position overlying the first position.

At 520, one or more additional SiGe layers are formed at a position overlying the first SiGe layer. In some embodiments, the one or more additional SiGe layers have maximum Ge concentrations greater than the Ge concentration of the first SiGe layer.

At 522, a final SiGe layer is formed at a position overlying the one or more additional SiGe layers. The final SiGe layer may comprise a silicon germanium layer having a constant Ge concentration or a silicon cap layer comprising un-doped pure silicon.

FIGS. 6-9 illustrate some embodiments of cross-sectional views of a semiconductor substrate showing a method of forming a strained channel transistor device having a discontinuous germanium concentration profile within a channel region. Although FIGS. 6-9 are described in relation to method 500, it will be appreciated that the structures disclosed in FIGS. 5-8 are not limited to such a method.

Figure 6:
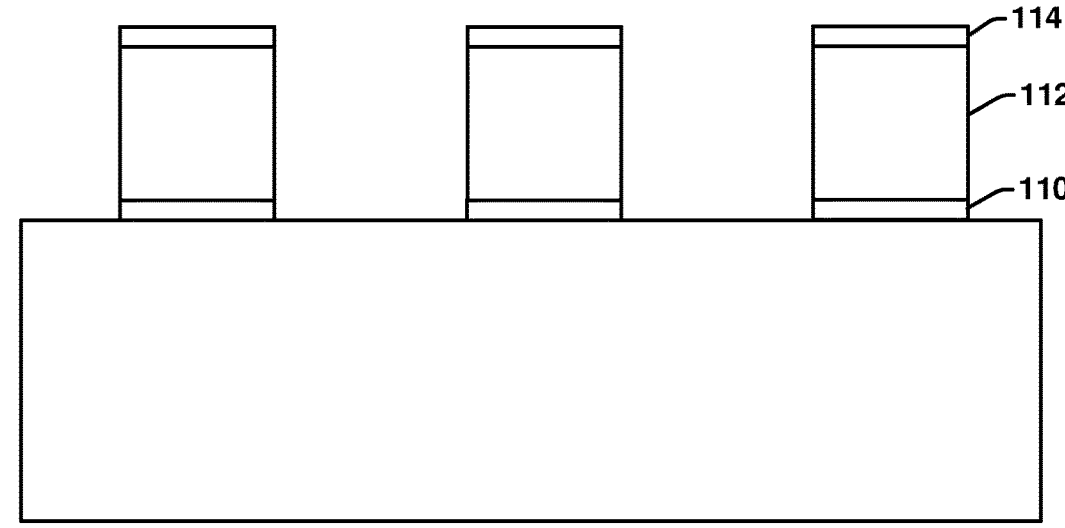

FIG. 6 illustrates a cross-sectional view 600 of some embodiments of a semiconductor substrate corresponding to acts 502-504.

As shown in cross-sectional view 600, a gate structure is formed onto a semiconductor substrate 102. The gate structure comprises a gate dielectric layer 110 that is selectively formed onto the semiconductor substrate 102. The gate dielectric layer 110 may be formed by a deposition process (e.g., a chemical vapor deposition, physical vapor deposition, etc.) or by thermal oxidation. In some embodiments, the gate dielectric layer 110 may comprise an insulating material, such as silicon dioxide ($SiO_2$) or a high-k dielectric material, for example.

A gate electrode layer 112 is formed over the gate dielectric layer 110. The gate electrode layer 112 may comprise polysilicon or a metal gate material, deposited by way of a deposition process. A hardmask layer 114 is then selectively formed over the gate electrode layer 112 and the gate dielectric layer 110. The gate dielectric layer 110 and the gate electrode layer 112 are subsequently etched according to the hardmask layer 114 to define a gate area, as shown in cross-sectional view 600.

Figure 7:
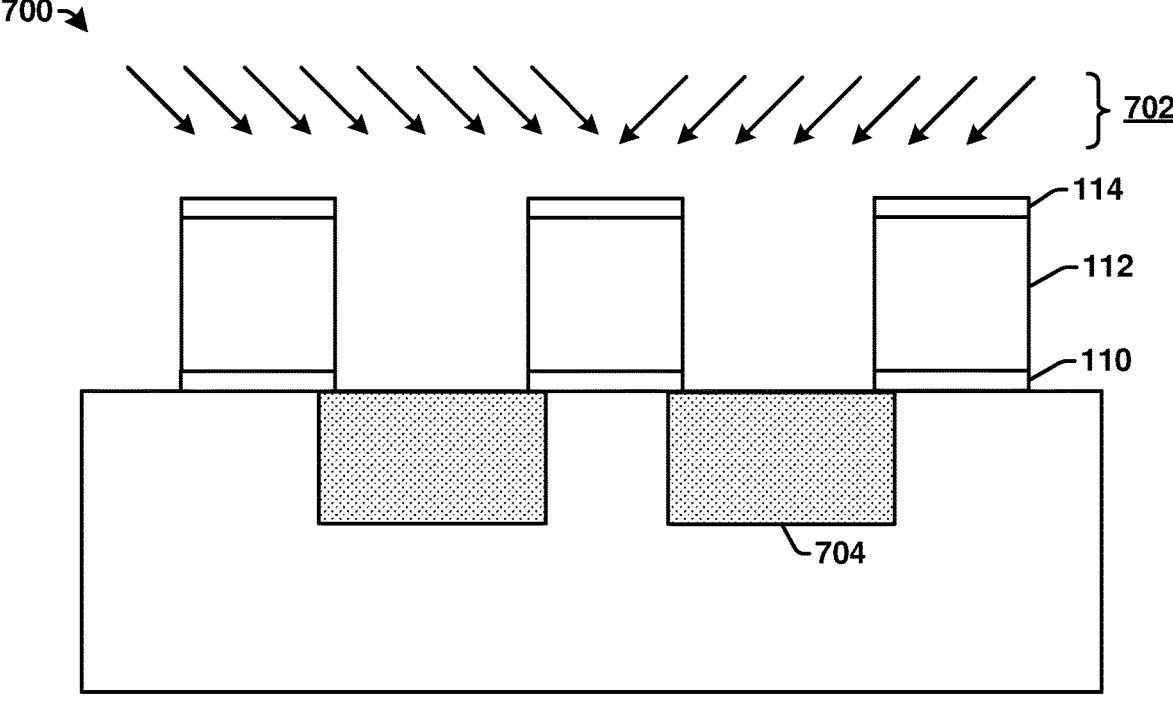

FIG. 7 illustrates a cross-sectional view 700 of some embodiments of a semiconductor substrate corresponding to acts 506-508.

As shown in cross-sectional view 700, one or more implantations 702 are performed to introduce dopants into the semiconductor substrate 102 and to thereby form implantation areas 704 disposed between gate structures. In some embodiments, the one or more implantations 702 may comprise a pocket implantation. The pocket implantation improves anti-punch through control of a transistor device. In various embodiments, the pocket implantation may comprise an arsenic (As) dopant and/or a phosphorus (P) dopant. In some embodiments, the pocket implantation may be performed at an energy having a range of between approximately 20 KeV (kiloelectron volts) and approximately 80 KeV, with a dose having a range of between approximately 1e12 atoms/cm² and approximately 1e14 atoms/cm², and at a tilt angle having a range of between approximately 150 and approximately 45°.

In other embodiments, the one or more implantations 702 may comprise a lightly doped drain (LDD) implantation performed on the semiconductor substrate 102. The LDD implantation improves SCE (short channel effects) control. In various embodiments, the LDD implantation may comprise a boron difluoride ($BF_2$) dopant, or a boron (B) dopant. The LDD implantation may be performed at an energy having a range of between approximately 1 KeV and approximately 10 KeV, with a dose having a range of between approximately 1e13 atoms/cm² and approximately 1e16 atoms/cm², and at a tile angle having a range of between approximately 0° and approximately 30°

Figure 8A:
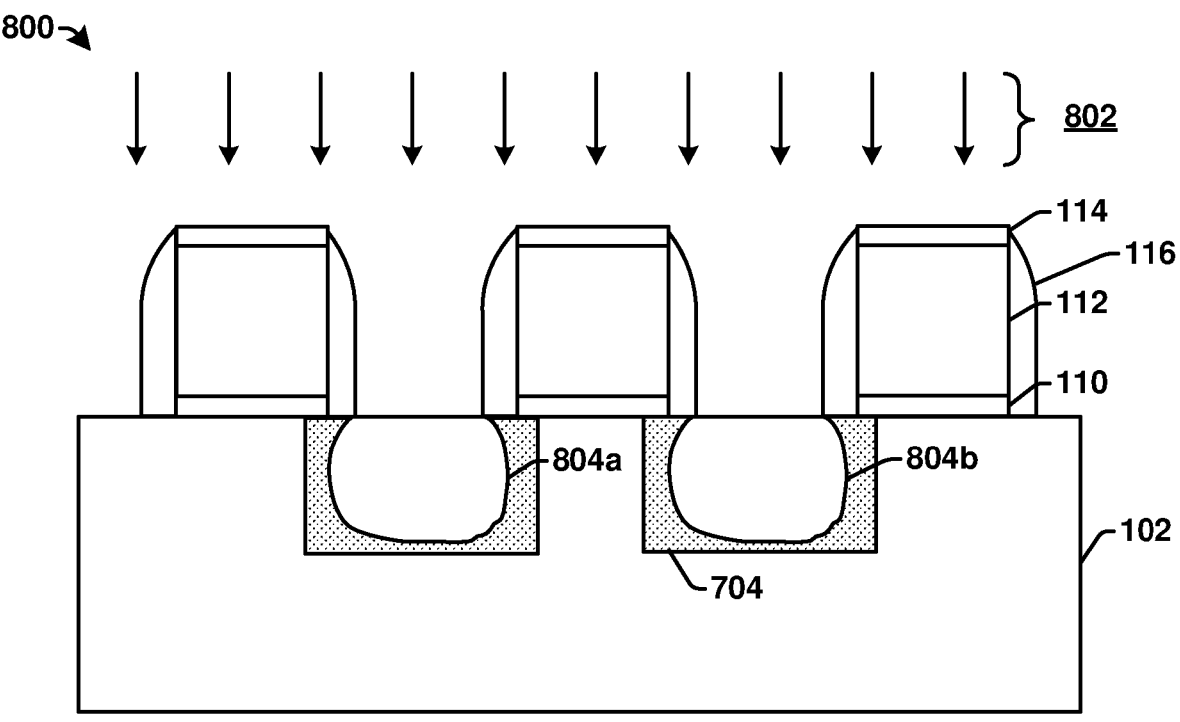
Figure 8B:
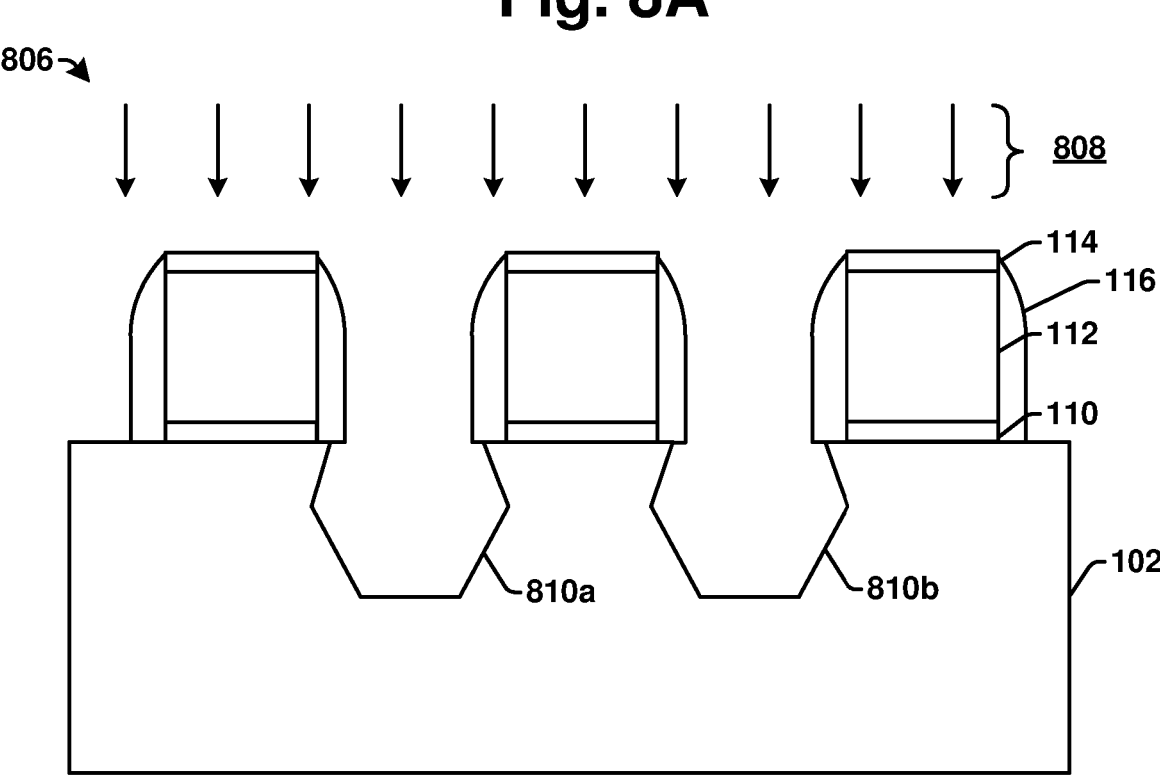

FIGS. 8A-8B illustrates a cross-sectional view 800 of some embodiments of a semiconductor substrate corresponding to acts 510 and 512. As shown in FIGS. 8A-8B, sidewall spacers 116 are formed around the gate stack. In some embodiments, sidewall spacers 116 may be formed on opposing sides of the gate structure prior to formation of the source and drain recesses, 810a and 810b. In some embodiments, the sidewall spacers 116 may be formed by depositing nitride onto the semiconductor substrate 102 and selectively etching the nitride to form the sidewall spacers 116.

The semiconductor substrate 102 is then selectively etched to form source and drain recesses, 810a and 810b. In some embodiments, the source and drain recesses, 810a and 810b may be formed by a multi-etch process.

For example, as shown in cross-sectional view 800, the semiconductor substrate 102 may be exposed to an isotropic etchant 802 configured to produce recesses, 804a and 804b, having an isotropic etch profile (e.g., a U-shaped etch profile). In some embodiments, the isotropic etchant 802 may comprise a dry etchant. For example, in some embodiments, the isotropic etchant 802 may comprise a dry etchant using a processing gas including tetrafluoromethane ($CF_4$), chlorine gas ($Cl_2$), nitrogen trifluoride ($NF_3$), sulfur hexafluoride ($SF_6$), and/or helium (He).

As shown in cross-sectional view 806, the semiconductor substrate 102 may be further exposed to an anisotropic etchant 808. The anisotropic etchant 808 further etches recesses, 804a and 804b, to produce source and drain recesses, 810a and 810b, having an anisotropic etch profile. In some embodiments, the source and drain recesses, 810a and 810b, may have top corners that extend below the sidewall spacers 116. In other embodiments, the source and drain recesses, 810a and 810b, may have top corners that are located at positions aligned with outer edges of the sidewall spacers 116. It will be appreciated that a larger the distance that the top corners of the source and drain recesses, 810a and 810b, extend below the sidewall spacers 116, the greater the amount of strain on the strained channel MOSFET.

In some embodiments, the anisotropic etchant 808 may comprise a wet etchant. For example, the anisotropic etchant 808 may comprise tetramethylammonium hydroxide (TMAH). TMAH produces <111> planes within recesses, 810a and 810b, to form a 'V' shaped or diamond shaped recess. In some embodiments, the semiconductor substrate 102 may be exposed to a TMAH etchant comprising an aqueous solution having a concentration of between 1-30% within a processing chamber held at a temperature of between approximately 20° C. and approximately 100° C., to form a recess depth of between approximately 300 Å and approximately 1000 Å.

FIG. 9 illustrates a cross-sectional view 900 of some embodiments of a semiconductor substrate corresponding to acts 516-518.

As shown in cross-sectional view 900, a multi-layer SiGe growth process is performed to form a strain inducing SiGe material within the source and drain recesses, 810a and 810b. In some embodiments, a first SiGe layer 106a is formed onto a bottom surface of the source and drain recesses, 810a and 810b, at positions that cover top corners of the source and drain recess recesses, 810a and 810b. The first SiGe layer 106a comprises a gradient germanium concentration that changes from a high germanium concentration at a first position to a lower germanium concentration at a second position overlying the first position. In some embodiments, the germanium concentration ranges from an initial value of approximately 40% to a value of approximately 10%.

In some embodiments, a second SiGe layer 106b is formed onto a first SiGe layer 106a. The second SiGe layer 106b comprises a gradient germanium concentration profile that changes from a low concentration at a third position to a higher concentration at a fourth position overlying the third position.

In some embodiments, a third SiGe layer 106c is formed onto a second SiGe layer 106b. The third SiGe layer 106c may comprise a silicon germanium layer having a constant germanium concentration or a silicon cap layer comprising un-doped pure silicon.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the FIGS. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a transistor device having a strained source/drain region comprising a strained inducing material having a discontinuous germanium concentration profile, and an associated method of formation.

In some embodiments, the present disclosure relates to a transistor device. The transistor device includes a gate structure arranged over a semiconductor substrate, and a strained source/drain region arranged within the semiconductor substrate along a side of the gate structure. The strained source/drain region comprises a first layer and a second layer over the first layer. The first layer has a strain inducing component with a first concentration profile that decreases as a distance from the second layer decreases, and the second layer has the strain inducing component with a second non-zero concentration profile that is discontinuous with the first concentration profile.

In other embodiments, the present disclosure relates to a transistor device. The transistor device includes a gate structure disposed over a substrate. A source/drain region is arranged along a side of the gate structure and comprises a first region and a second region that is separated from the substrate by the first region. The first region has a first strain inducing component concentration profile that decreases in a first direction pointing away from the substrate and the second region has a second strain inducing component concentration profile that increases in the first direction.

In yet other embodiments, the present disclosure relates to a transistor device. The transistor device includes a gate structure disposed over a substrate having a plurality of interior surfaces defining a recess. A source/drain region is arranged within the recess and comprises a first layer arranged on the plurality of interior surfaces and a second layer separated from the plurality of interior surfaces by the first layer. The first layer comprises a strain inducing component with a first concentration profile that decreases as a distance from an adjacent one of the plurality of interior surfaces increases.

What is claimed is:

1. An integrated chip, comprising:
 a gate structure arranged over a substrate;
 a source/drain region arranged within the substrate along a side of the gate structure, the source/drain region comprising:
  a first layer lining interior sidewalls of the substrate and a horizontally extending surface of the substrate contacting the interior sidewalls of the substrate;

a second layer lining interior sidewalls of the first layer and a horizontally extending surface of the first layer contacting the interior sidewalls of the first layer on opposing sides of the first layer; and wherein the first layer has a strain inducing component with a first strain inducing component concentration that continually decreases from outermost sidewalls of the first layer facing the substrate to the interior sidewalls of the first layer and the second layer has the strain inducing component with a second strain inducing component concentration that changes as distances from outermost sidewalls of the second layer increase.

2. The integrated chip of claim 1, wherein the first strain inducing component concentration continually decreases at a substantially constant rate between the outermost sidewalls of the first layer and the interior sidewalls of the first layer.

3. The integrated chip of claim 1, wherein the second strain inducing component concentration is larger than the first strain inducing component concentration and increases as the distances from the outermost sidewalls of the second layer increase.

4. The integrated chip of claim 1, wherein the source/drain region has a maximum strain inducing component concentration along an upper surface of the second layer.

5. The integrated chip of claim 1, wherein the first strain inducing component concentration continually decreases between a bottommost surface of the first layer and an upper surface of the first layer.

6. The integrated chip of claim 5, wherein the second strain inducing component concentration continually increases between a bottommost surface of the second layer and an upper surface of the second layer.

7. The integrated chip of claim 1, further comprising:

a second source/drain region arranged within the substrate along a second side of the gate structure opposing the side of the gate structure; and a channel region disposed vertically below the gate structure and laterally between the source/drain region and the second source/drain region, wherein the first strain inducing component concentration decreases from a first value to a lower second value, the first value being directly between the second value and the channel region.

8. The integrated chip of claim 1, wherein the second strain inducing component concentration increases from an outermost sidewall of the second layer to within the second layer.

9. The integrated chip of claim 1, wherein the first strain inducing component concentration decreases along a first line extending through a first surface of the first layer and along a second line extending through a second surface of the first layer, the first line intersecting the second line above the first layer.

10. The integrated chip of claim 1, wherein the strain inducing component comprises material configured to induce compressive strain or tensile strain on a channel region underlying the gate structure.

11. The integrated chip of claim 1, wherein the horizontally extending surface of the first layer is set back from opposing ends of the horizontally extending surface of the substrate by non-zero distances.

12. An integrated chip, comprising:

a substrate;

a gate structure disposed over an upper surface of the substrate;

source/drain regions arranged along opposing sides of the gate structure;

a channel region disposed vertically below the gate structure and laterally between the source/drain regions, wherein the source/drain regions respectively have a strain inducing component concentration profile that decreases from a first value to a lower second value at a first gradient and that decreases from the second value to a third value at a second gradient;

wherein the first gradient does not equal the second gradient; and wherein the first value is a smaller vertical distance from the upper surface of the substrate than the second value, and the second value is a smaller vertical distance from the upper surface of the substrate than the third value.

13. The integrated chip of claim 12, wherein the source/drain regions respectively comprise a first region closest to the substrate and a second region that is separated from the substrate by the first region; and wherein the first region has a first strain inducing component concentration profile that decreases in a first direction pointing away from the substrate and the second region has a second strain inducing component concentration profile that has a minimum value that is greater than a maximum value of the first strain inducing component concentration profile.

14. The integrated chip of claim 13, wherein the first strain inducing component concentration profile is discontinuous with the second strain inducing component concentration profile.

15. The integrated chip of claim 12, wherein the source/drain regions are disposed along a <111> surface of the substrate, the first value of the strain inducing component concentration profile being a first distance from the <111> surface and the second value being a second distance from the <111> surface, the first distance being smaller than the second distance.

16. The integrated chip of claim 12, wherein the strain inducing component concentration profile decreases along a first line extending through a first point along a first surface of the source/drain regions and along a second line extending through a second point along a second surface of the source/drain regions, the first line intersecting the second line above the first point and the second point.

17. An integrated chip, comprising:

a gate structure arranged over a semiconductor substrate, wherein the semiconductor substrate comprises interior surfaces forming source/drain recesses along opposing sides of the gate structure;

source/drain regions arranged within the source/drain recesses; and wherein the source/drain regions comprise a strain inducing component having a strain inducing component concentration profile that changes from a first concentration at a first position, to a second concentration at a second position overlying the first position, to a third concentration at a third position overlying the second position and vertically below a bottommost surface of the gate structure, the first concentration being larger than the second concentration and smaller than the third concentration.

18. The integrated chip of claim 17, wherein the strain inducing component concentration profile within the source/drain regions decreases along a first line extending through a first point along a first surface of the source/drain regions and along a second line extending through a second point along a second surface of the source/drain regions, the first line intersecting the second line above the first point and the second point.

19. The integrated chip of claim 17, wherein the strain inducing component concentration profile comprises a plurality of discontinuities along a line that is perpendicular to a bottom of the source/drain regions.

20. The integrated chip of claim 17, wherein the strain inducing component comprises germanium or silicon carbide.

\* \* \* \* \*